United States Patent [19]

Bloom et al.

[11] Patent Number: 5,677,783
[45] Date of Patent: Oct. 14, 1997

[54] METHOD OF MAKING A DEFORMABLE GRATING APPARATUS FOR MODULATING A LIGHT BEAM AND INCLUDING MEANS FOR OBVIATING STICTION BETWEEN GRATING ELEMENTS AND UNDERLYING SUBSTRATE

[75] Inventors: David M. Bloom, Portolla Valley; Francisco S. A. Sandejas, Menlo Park; Olav Solgaard; Raj B. Apte, both of Palo Alto, all of Calif.

[73] Assignee: The Board of Trustees of the Leland Stanford, Junior University, Stanford, Calif.

[21] Appl. No.: 404,139

[22] Filed: Mar. 13, 1995

Related U.S. Application Data

[60] Division of Ser. No. 62,688, May 20, 1993, Pat. No. 5,459,610, which is a continuation-in-part of Ser. No. 876,078, Apr. 28, 1992, Pat. No. 5,311,360.

[51] Int. Cl.$^6$ ............................................. G02B 26/08
[52] U.S. Cl. ........................ 359/224; 359/291; 359/295; 359/572; 359/846; 359/900; 156/644.1; 216/2; 437/927
[58] Field of Search .................................. 359/224, 230, 359/231, 290, 291, 292, 295, 298, 558, 566, 569, 572, 573, 846, 855, 900; 345/85, 108; 348/203; 216/2; 156/625.1, 644.1; 437/927

[56] References Cited

U.S. PATENT DOCUMENTS

| | | | |
|---|---|---|---|
| 4,492,435 | 1/1985 | Banton et al. | 359/295 |
| 4,705,659 | 11/1987 | Berstein et al. | 264/29.6 |
| 4,968,585 | 11/1990 | Albrecht et al. | 430/320 |
| 5,061,049 | 10/1991 | Hornbeck | 359/213 |
| 5,151,724 | 9/1992 | Kikinis | 357/217 |
| 5,179,499 | 1/1993 | MacDonald et al. | 361/313 |
| 5,233,456 | 8/1993 | Nelson | 359/224 |
| 5,256,869 | 10/1993 | Lin et al. | 250/201.9 |
| 5,262,000 | 11/1993 | Welbourn et al. | 156/643 |
| 5,311,360 | 5/1994 | Bloom et al. | 359/572 |
| 5,331,454 | 7/1994 | Hornbeck | 359/224 |

*Primary Examiner*—Paul M. Dzierzynski
*Assistant Examiner*—John Juba, Jr.
*Attorney, Agent, or Firm*—Claude A. S. Hamrick

[57] ABSTRACT

A modulator for modulating incident rays of light, the modulator comprising a plurality of equally spaced apart beam elements, each of which includes a light reflective planar surface. The elements are arranged parallel to each other with their light reflective surfaces parallel to each other. The modulator includes means for supporting the beam elements in relation to one another and means for moving the beam elements relative to one another so that the beams move between a first configuration wherein the modulator acts to reflect the incident rays of light as a plane mirror, and a second configuration wherein the modulator diffracts the incident rays of light as they are reflected therefrom. In operation, the light reflective surfaces of the beam elements remain parallel to each other in both the first and the second configurations and the perpendicular spacing between the reflective surfaces of adjacent beam elements is equal to m/4 times the wavelength of the incident rays of light, wherein m=an even whole number or zero when the beam elements are in the first configuration and m=an odd number when the beam elements are in the second configuration.

12 Claims, 9 Drawing Sheets

METHOD OF MAKING A DEFORMABLE GRATING APPARATUS FOR MODULATING A LIGHT BEAM AND INCLUDING MEANS FOR OBVIATING STICTION BETWEEN GRATING ELEMENTS AND UNDERLYING SUBSTRATE

RELATED CASES

This is a divisional of application Ser. No. 08/062,688 filed on May 20, 1993 now U.S. Pat. No. 5,459,610, which is a continuation-in-part of U.S. patent application Ser. No. 07/876,078 filed on Apr. 28, 1992 now U.S. Pat. No. 5,311,360.

BACKGROUND OF THE INVENTION

1. Field of the Invention

This invention relates to a method and apparatus for modulating a light beam and more particularly to the use of a reflective, deformable diffraction grating for performing such modulation.

2. Brief Description of the Prior Art

Devices which modulate a light beam, e.g. by altering the amplitude, frequency or phase of the light, find a number of applications. An example of such a device is a spatial light modulator (SLM) which is an electronically or optically controlled device which consists of one or two-dimensional reconfigurable patterns of pixel elements, each of which can individually modulate the amplitude, phase or polarization of an optical wavefront.

These devices have been extensively developed, particularly for applications in the areas of optical processing and computing. They can perform a variety of functions such as: analog multiplication and addition, signal conversion (electrical-to-optical, incoherent-to-coherent, amplification, etc.), nonlinear operations and short term storage. Utilizing these functions, SLMs have seen many different applications from display technology to optical signal processing. For example, SLMs have been used as optical correlators (e.g., pattern recognition devices, programmable holograms), optical matrix processors (e.g., matrix multipliers, optical cross-bar switches with broadcast capabilities, optical neural networks, radar beam forming), digital optical architectures (e.g., highly parallel optical computers) and displays.

The requirements for SLM technology depend strongly on the application in mind: for example, a display requires low bandwidth but a high dynamic range while optical computers benefit from high response times but don't require such high dynamic ranges. Generally, systems designers require SLMs with characteristics such as: high resolution, high speed (kHz frame rates), good gray scale high contrast ratio or modulation depth, optical flatness, VLSI compatible, easy handling capability and low cost. To date, no one SLM design can satisfy all the above requirements. As a result, different types of SLMs have been developed for different applications, often resulting in tradeoffs.

Texas Instrument, for instance, has developed a "Deformable Mirror Device (DMD)" that utilizes an electromechanical means of deflecting an optical beam. The mechanical motions needed for the operation of the DMD are relatively large and, as a result, the bandwidths are limited to tens of kilohertz. This device, however, gives good contrast ratios and high-resolution and is, furthermore, compatible with CMOS, and other low power technologies.

Nematic and ferroelectric liquid crystals have also been used as the active layer in several SLMs. Since the electrooptic effect in liquid crystals is based on the mechanical reorientation of molecular dipoles, it is to be expected that liquid crystals are faster than the DMD-type devices. Modulators using ferroelectric liquid crystals have exhibited moderate switching speeds (150 μsec to 100 nsec), low-power consumption, VLSI compatible switching voltages (5–10 V), high extinction ratios, high resolution and large apertures. However, these devices suffer from the drawbacks of limited liquid crystal lifetimes and operating temperature ranges. In addition, the manufacturing process is complicated by alignment problems and film thickness uniformity issues.

Magnetooptic modulation schemes have been used to achieve faster switching speeds and to provide an optical pattern memory cell. Although these devices, in addition to achieving fast switching speeds, can achieve large contrast ratios, they suffer from a low (<10%) throughput efficiency and are, therefore, often unsuitable for many applications.

The need is therefore for a light modulation device which overcomes these drawbacks.

Beside SLMs, another area of use of light modulators is in fiber optics. Fiber optic modulators are electronically controlled devices that modulate light intensity and are designed to be compatible with optical fibers. For high speed communication applications, lithium niobate ($LiNbO_3$) traveling wave modulators represent the state-of-the-art, but there is a need for low power, high efficiency, low loss, inexpensive fiber optic modulators, that can be integrated with silicon sensors and electronics, for data acquisition and medical applications.

A typical use of a modulator combined with fiber optic technology, for example, is a data acquisition system on an airplane which consists of a central data processing unit that gathers data from remote sensors. Because of their lightweight and electro-magnetic immunity characteristics, fiber optics provide an ideal communication medium between the processor and the sensors which produce an electrical output that must be converted to an optical signal for transmission. The most efficient way to do this is to have a continuous wave laser at the processor and a modulator operating in reflection at the sensor. In this configuration, it is also possible to deliver power to the sensor over the fiber.

In this type of application the modulator should operate with high contrast and low insertion loss to maximize the signal to noise ratio and have low power consumption. It should further be compatible with silicon technology because the sensors and signal conditioning electronics used in these systems are largely implemented in silicon.

Another use of a modulator combined with fiber optic technology is in the monitoring of sensors that are surgically implanted in the human body. Here optical fibers are preferred to electrical cables because of their galvanic isolation, and any modulator used in these applications should exhibit high contrast combined with low insertion loss because of signal to noise considerations. Furthermore, as size is important in implanted devices, the modulator must be integratable with silicon sensors and electronics.

There exist no prior art devices that have the characteristics enumerated above. Modulators based on the electrooptic, Franz-Keldysh, Quantum-Confined-Stark or Wannier-Stark effect in III–V semiconductors have high contrast and low insertion loss, but are expensive and not compatible with silicon devices. Waveguide modulators employing glass or epilayers on silicon, require too much area and too complex fabrication to be easily integratable with other silicon devices. Silicon modulators that do not employ waveguides and that are based on the plasma effect, require high electrical drive power and do not achieve high contrast.

The need is therefore for a light modulator which can be used with fiber optic technology with low power, high efficiency, low loss, low cost and compatibility with multi-mode optical fibers and silicon technology.

SUMMARY OF THE INVENTION

Objects of the Invention

Accordingly, it is an object of this invention to provide a light modulator which alone or together with other modulators exhibits most of the following characteristics: high resolution, high speed (Khz frame rates), gray levels (100 levels), high contrast ratio or modulation depth, optical flatness, VLSI compatible, easy handling capability and low cost.

A further object of this invention is to provide a light modulator which has a tolerance for high optical power and good optical throughput.

Yet another object of this invention is to provide a light modulator which is compatible with CMOS technology.

Still another object of this invention is to provide a light modulator capable of use with fiber optic technology.

A final object of this invention is to provide a light modulator which is capable of modulating white light to produce colored light.

Summary

Briefly a presently preferred embodiment of this invention includes a modulator for modulating incident rays of light, the modulator comprising a plurality of equally spaced apart beam elements, each of which includes a light reflective planar surface. The elements are arranged parallel to each other with their light reflective surfaces parallel to each other. The modulator includes means for supporting the beam elements in relation to one another and means for moving the beam elements relative to one another so that the beams move between a first configuration wherein the modulator acts to reflect the incident rays of light as a plane mirror, and a second configuration wherein the modulator diffracts the incident rays of light as they are reflected therefrom. In operation, the light reflective surfaces of the beam elements remain parallel to each other in both the first and the second configurations and the perpendicular spacing between the reflective surfaces of adjacent beam elements is equal to m/4 times the wavelength of the incident rays of light, wherein m=an even whole number or zero when the beam elements are in the first configuration and m=an odd number when the beam elements are in the second configuration.

One embodiment of this invention includes a reflective deformable grating light modulator, with a grating amplitude that can be controlled electronically, consisting of a reflective substrate with a deformable grating suspended above it. In its undeformed state, with no voltage applied between the elements of the grating and the substrate, the grating amplitude is one half of the wavelength of the incoming light. Since the round-trip path difference between the light reflected from the top and bottom of the grating is one wavelength, no diffraction occurs. When a voltage is applied between the grating elements and the substrate, the electrostatic force pulls the elements down to cause the grating amplitude to become one quarter of the wavelength so that reflections from the elements and the substrate add destructively, causing the light to be diffracted. If the detection system for the reflected light has a numerical aperture which accepts only the zero order beam, a mechanical motion of only one quarter of a wavelength is sufficient to modulate the reflected light with high contrast.

Typically the grating is formed by lithographically etching a film made of silicon nitride, aluminum, silicon dioxide or any other material which can be lithographically etched.

The deformable grating modulator of this invention has the advantage that it is implemented in silicon technology, using micromachining and sacrificial etching of thin films to fabricate the gratings. Circuitry for addressing and multiplexing can be manufactured on the same silicon substrate and thus be directly integrated with the modulator. Direct integration with electronics is an important advantage over non-silicon based technologies like liquid crystal and electrooptic SLMs. Moreover, the device demonstrates simplicity of fabrication and can be manufactured with only a few lithographic steps.

A further advantage of the deformable grating modulator is that because the deformable grating modulator utilizes diffraction rather than deflection of a light beam, the required mechanical motions are reduced from several microns (as in deformable mirror devices) to tenths of a micron, thus allowing for a potential three orders of magnitude in increase in speed. This speed is comparable to the fastest liquid crystal modulators, but without the device suffering the same complexity in the manufacturing process.

Still a further advantage of these devices is that the required motion of the grating elements is only one quarter of a wavelength, which means that elements with high resonance frequencies can be used.

These and other objects and advantages of the present invention will no doubt become apparent to those skilled in the art after having read the following detailed description of the preferred embodiment which is illustrated in the several figures of the drawing.

IN THE DRAWING

This invention will now be further illustrated with reference to the accompanying drawing in which:

FIG. 4 and illustrates the operation of the modulator of FIG. 3 in its "diffracting" mode;

FIGS. 12a to 20 are sections illustrating further embodiments of the modulator.

DESCRIPTION OF PREFERRED EMBODIMENTS

First Embodiment

Figure 1:
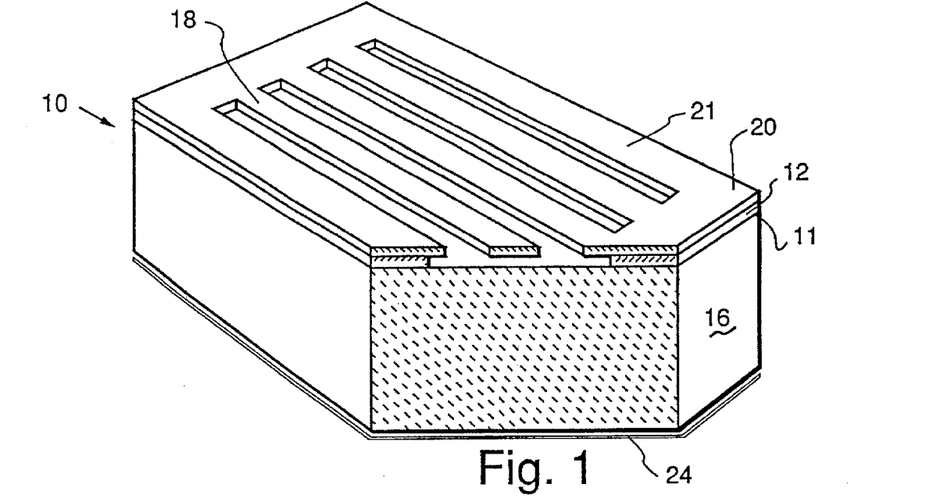
FIG. 1 is an isometric, partially cut-away view of the modulator of the invention.
Figure 1A:
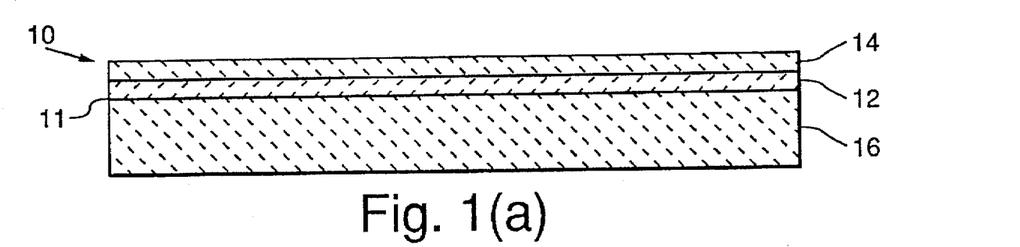
Figure 1B:
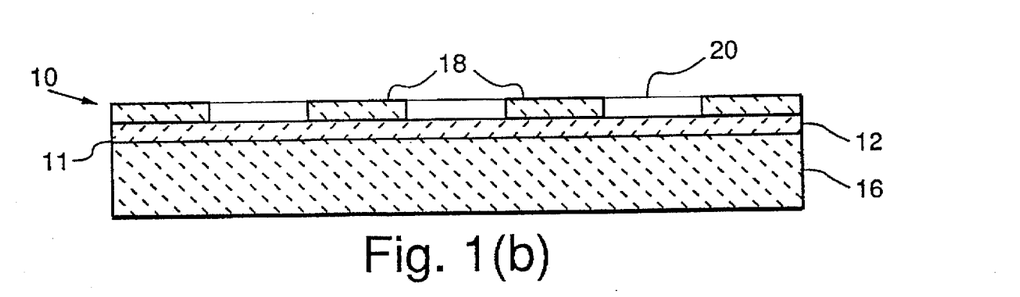
Figure 1C:
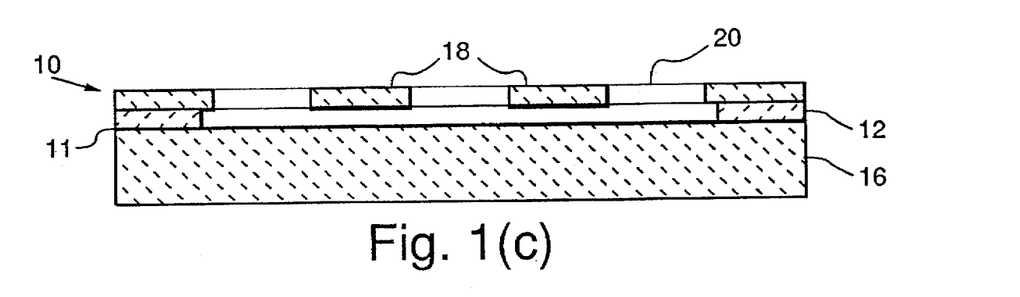
Figure 1D:
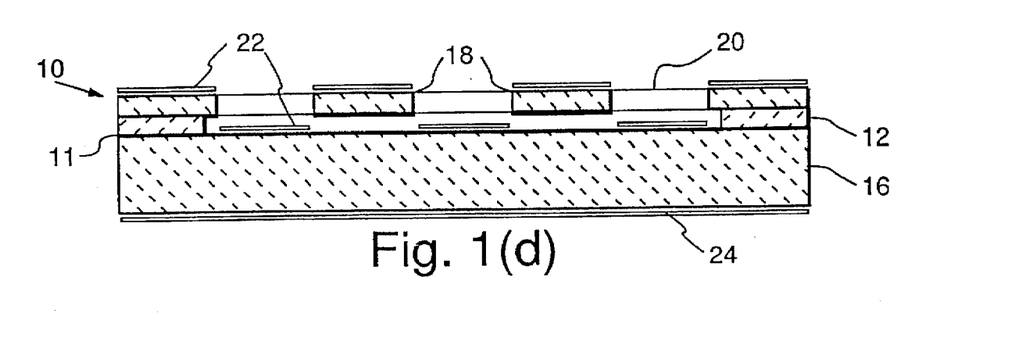

The deformable diffracting grating light modulator of the invention is generally indicated as 10 in FIG. 1. The modulator 10 includes a number of beams 18 which define a grating which, as will be later explained, can be used to modulate a light beam. The beams 18 are formed integrally with an encompassing frame 21 which provides a relatively rigid supporting structure and maintains the tensile stress within the beams 18. This structure defines a grating 20 which is supported by a partially etched silicon dioxide film 12 a distance of 213 nm above the surface of a silicon substrate 16.

Before commencing the description of how the modulator 10 is fabricated, it should be noted that, in this case, each of the beams 18 are 213 nm thick and are suspended a distance of 213 nm clear of the substrate 16. This means that the distance from the top of each beam to the top of the substrate is 426 nm. This distance is known as the grating amplitude.

One method of fabricating the modulator 10 is illustrated in FIG. 2(a)–(d).

Figure 2A:
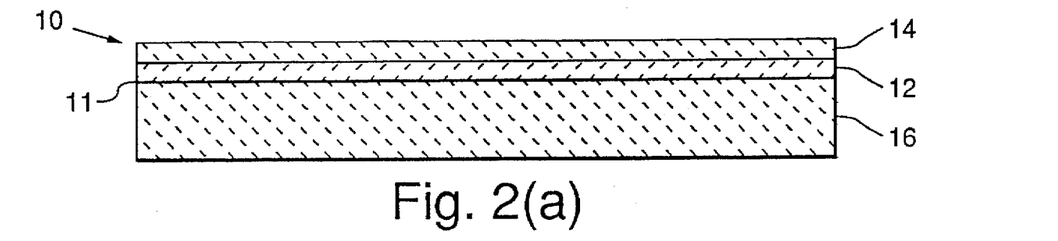
FIGS. 2(a)–(d) are cross-sections through a silicon substrate illustrating the manufacturing process of the modulator illustrated in FIG. 1.

The first step, as illustrated in FIG. 2(a), is the deposition of an insulating layer 11 made of stoichemetric silicon nitride topped with a buffer layer of silicon dioxide. This is followed by the deposition of a sacrificial silicon dioxide film 12 and a low-stress silicon nitride film 14, both 213 nm thick, on a silicon substrate 16. The low-stress silicon nitride film 14 is achieved by incorporating extra silicon (beyond the stoichiometric balance) into the film, during the deposition process. This reduces the tensile stress in the silicon nitride film to roughly 200 MPa.

Figure 2B:
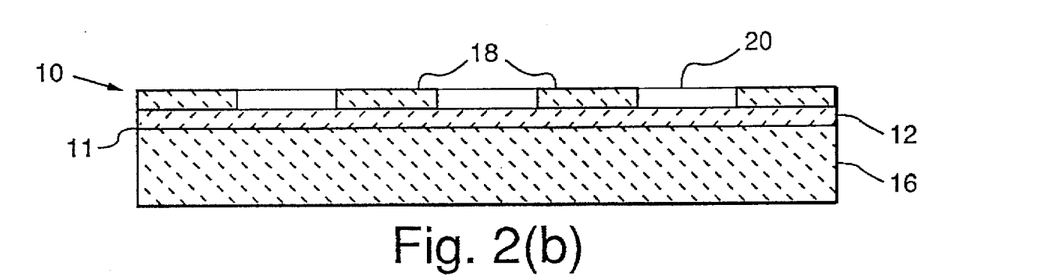

In the second step, which is illustrated in FIG. 2(b), the silicon nitride film 14 is lithographically patterned into a grid of grating elements in the form of elongate beams 18. After this lithographic patterning process a peripheral silicon nitride frame 21 remains around the entire perimeter of the upper surface of the silicon substrate 16. In an individual modulator, all the beams are of the same dimension and are arranged parallel to one another with the spacing between adjacent beams equal to the beam width. Depending on the design of the modulator, however, beams could typically be 1, 1.5 or 2 µm wide with a length that ranges from 10 µm to 120 µm.

Figure 2C:
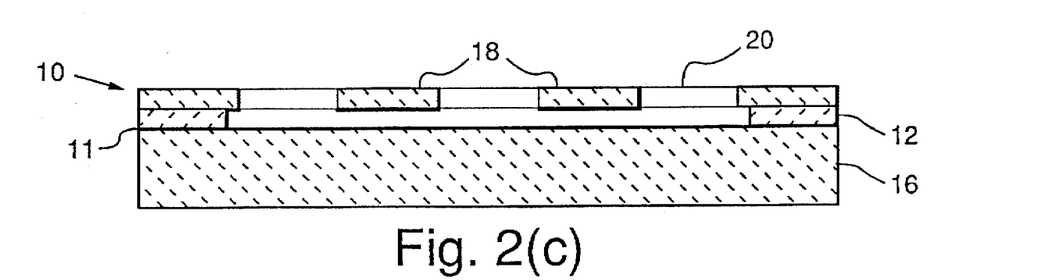

After the patterning process of the second step, the sacrificial silicon dioxide film 12 is etched in hydrofluoric acid, resulting in the configuration illustrated in FIG. 2(c). It can be seen that each beam 18 now forms a free standing silicon nitride bridge, 213 nm thick, which is suspended a distance of 213 nm (this being the thickness of the etched away sacrificial film 12) clear of the silicon substrate. As can further be seen from this figure the silicon dioxide film 12 is not entirely etched away below the frame 21 and so the frame is supported, a distance of 213 nm, above the silicon substrate 16 by this remaining portion of the silicon dioxide film 12. The beams 18 are stretched within the frame and kept straight by the tensile stress imparted to the silicon nitride film 14 during the deposition of that film.

Figure 2D:
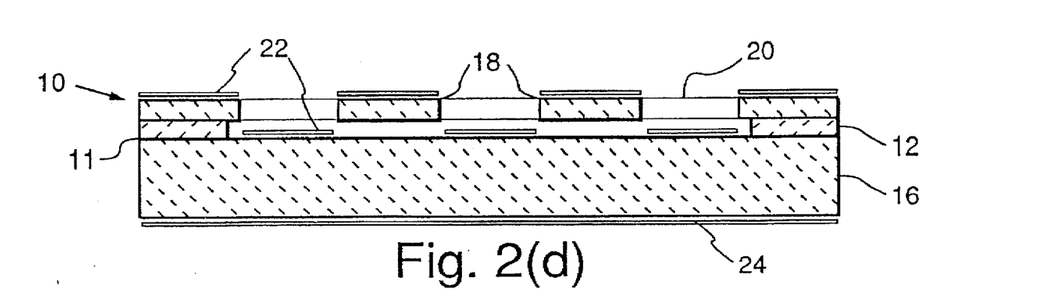

The last fabrication step, illustrated in FIG. 2(d), is sputtering, through a stencil mask, of a 50 nm thick aluminum film 22 to enhance the reflectance of both the beams 18 and the substrate 16 and to provide a first electrode for applying a voltage between the beams and the substrate. A second electrode is formed by sputtering an aluminum film 24, of similar thickness, onto the base of the silicon substrate 16.

It should be realized that the above described manufacturing process illustrates only one type of modulator and only one fabrication process. A more detailed description of other fabrication possibilities will be given below with reference to FIGS. 12 to 18.

Figure 3:
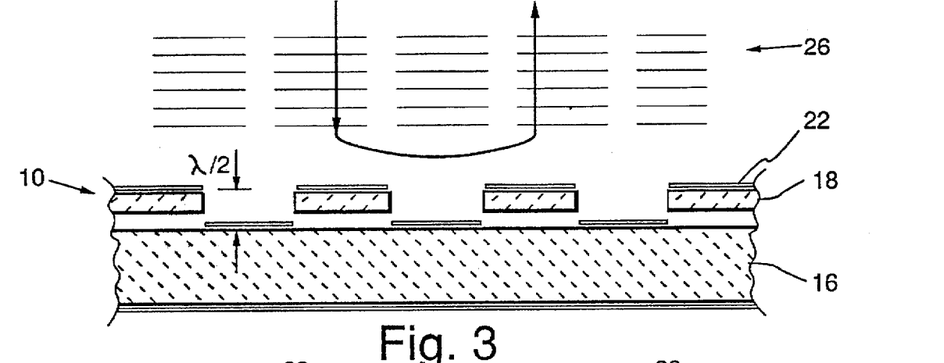
FIG. 3 illustrates the operation of the modulator in its "non-defracting" mode.

The operation of the modulator 10 is illustrated with respect to FIGS. 3 and 4.

In FIG. 3 the modulator 10 is shown with no voltage applied between the substrate 16 and the individual beams 18 and with a lightwave, generally indicated as 26, of a wavelength $\lambda=852$ nm is incident upon the it. The grating amplitude of 426 nm is therefore equal to half of the wavelength of the incident light with the result that the total path length difference for the light reflected from the beams and from the substrate equals the wavelength of the incident light. Consequently, light reflected from the beams and from the substrate add in phase and the modulator 10 acts to reflect the light as a flat mirror.

However, as illustrated in FIG. 4, when a voltage is applied between the beams 18 and the substrate 16 the electrostatic forces pull the beams 18 down onto the substrate 16, with the result that the distance between the top of the beams and the top of the substrate is now 213 nm. As this is one quarter of the wavelength of the incident lights, the total path length difference for the light reflected from the beams and from the substrate is now one half of the wavelength (426 nm) of the incident light and the reflections interfere destructively, causing the light to be diffracted, indicated as 28.

Thus, if this modulator is used in combination with a system, for detecting the reflected light, which has a numerical aperture sized to detect one order of diffracted light from the grating e.g., the zero order, it can be used to modulate the reflected light with high contrast.

The electrical, optical and mechanical characteristics of a number of modulators, similar in design to the modulator illustrated above but of different dimensions were investigated by using a Helium Neon laser (of 633 nm wavelength) focused to a spot size of 36 µm on the center portion of each modulator. This spot size is small enough so that the curvature of the beams in the region where the modulator was illuminated can be neglected, but is large enough to allow the optical wave to be regarded as a plane wave and covering enough grating periods to give good separation between the zero and first order diffraction modes resulting from the operation of the modulator. It was discovered that grating periods (i.e., the distance between the centerlines of two adjacent beams in the grating) of 2,3 and 4 µm and a wavelength of 633 nm resulted in first order diffraction angles of 18°, 14° and 9° respectively.

Figure 5:
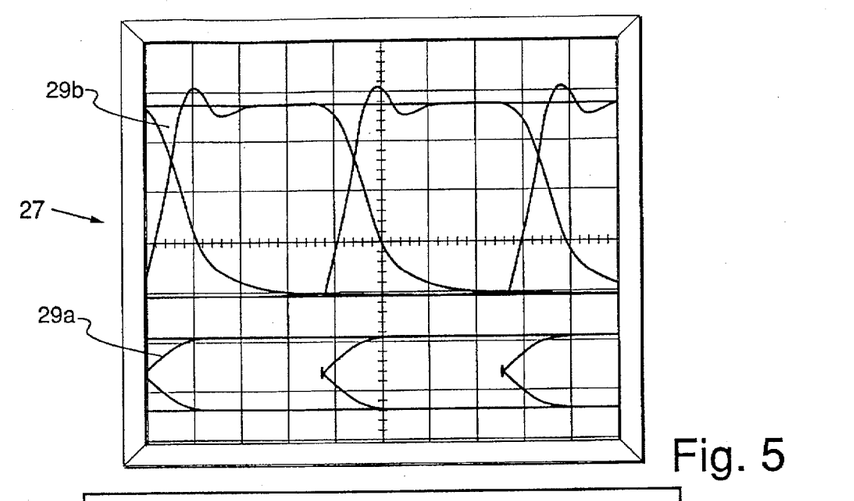
FIG. 5 is a graphical representation of the modulation of a laser beam by the modulator of the invention.

One of these first order diffracted light beams was produced by using a 120 µm-long grating modulator with 1.5 µm-wide beams at atmospheric pressure together with a HeNe light beam modulated at a bit rate of 500 kHz. detected by a low-noise photoreceiver and viewed on an oscilloscope. The resulting display screen 30 of the oscilloscope is illustrated in FIG. 5.

However, before proceeding with a discussion of the features illustrated in this figure, the resonant frequency of the grating elements should first be considered.

The resonant frequency of the mechanical structure of the diffraction grating of the modulator was measured by driving the modulator with a step function and observing the ringing frequency. The area of the aluminum on the modulator is roughly 0.2 cm$^2$, which corresponds to an RC limited 3-dB bandwidth of 1 MHz with roughly 100 ohms of series resistance. This large RC time constant slowed down the step function, however, enough power existed at the resonant frequency to excite vibrations, even in the shorter beams. Although the ringing could be observed in normal atmosphere, the Q-factor was too low (approximately 1.5) for accurate measurements, so the measurements were made at a pressure of 150 mbar. At this pressure, the Q-factor rose to 8.6, demonstrating that air resistance is the major damping mechanism, for a grating of this nature, in a normal atmosphere.

Nonetheless, it was found that due to the high tensile stress in the beams, tension is the dominant restoring force, and the beams could therefore be modeled as vibrating strings. When this was done and the measured and theoretically predicted resonance frequencies compared, it was found that the theory is in good agreement with the experimental values, particularly when considering the uncertainty in tensile stress and density of the beams. As it is known that the bandwidth of forced vibrations of a mechanical structure is simply related to the resonance frequency and Q-factor, a Q-factor of 1.5 yields a 1.5 dB bandwidth of the deformable grating modulator 1.4 times larger than the resonance frequency. The range of bandwidths for these gratings is therefore from 1.8 MHz for the deformable grating modulator with 120 µm beams to 6.1 MHz for the deformable grating modulator with 40 µm beams.

Returning now to FIG. 5, it should be noted that with an applied voltage swing of 3 V, a contrast of 16 dB for the 120 µm-long bridges could be observed. Here the term "modulation depth" is taken to mean the ratio of the change in optical intensity to peak intensity.

The input (lower trace 29a) on the screen 27 represents a pseudo-random bit stream switching between 0 and −2.7 V across a set of grating devices on a 1 cm by 1 cm die. The observed switching transient with an initial fast part followed by a RC dominated part, is caused by the series resistance of the deformable grating modulator, which is comparable to a 50 ohm source resistance.

The output (upper trace 29b) on the screen corresponds to the optical output of a low-noise photoreceiver detecting the first diffraction order of the grating used. The output (upper trace 29b) from the deformable grating is high when the beams are relaxed and low when the beams are deflected. Ringing is observed only after the rising transient, because of the quadratic dependence of the electro-static force on the voltage (during switching from a voltage of −2.7 V to 0 V, the initial, faster part of the charging of the capacitor corresponds to a larger change in electro-static force, than when switching the opposite way). This ringing in the received signal indicates a decay close to critical damping.

Furthermore, it was found that because the capacitance increases as the beams are pulled toward the substrate, the voltage needed for a certain deflection is not a linearly increasing function of this deflection. At a certain applied voltage condition, an incremental increase in the applied voltage causes the beams to be pulled spontaneously to the substrate (to latch) and this voltage is known as the "switching voltage" of the modulator. The switching voltage was found to be 3.2 V for gratings with 120 µm long beams and, if it is assumed that tension dominates the restoring forces, the switching voltage is inversely proportional to the beam length and therefore, the predicted switching voltage for 40 µm long beams will be 9.6 V.

The importance of the switching voltage is that below this voltage, the deformable grating modulator can be operated in an analog fashion, however, if a voltage greater than the switching voltage is applied to the modulator it acts in a digital manner. Nonetheless, it is important to note that operating the modulator to the point of contact is desirable from an applications point of view, because as discussed above when the beams are deflected electrostatically, an instability exists once the beam deflection goes beyond the halfway point. This results in hysteretic behavior which will "latch" the beam in the down position. This latching feature gives the modulator the advantages of an active matrix design without the need for active components. A further advantage of this latching feature is that once the beam has "latched" it requires only a very small "holding voltage", much smaller than the original applied voltage, to keep the beam in its latched configuration. This feature is particularly valuable in low power applications where efficient use of available power is very important.

Figure 6:
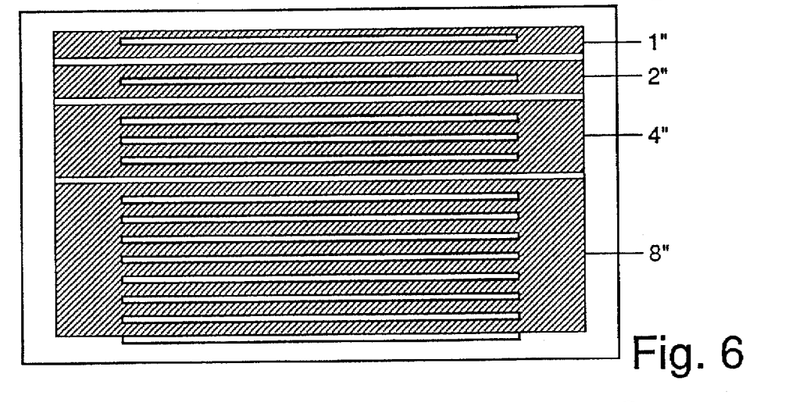
FIG. 6 is an illustration of how the modulator of the invention can be combined with other modulators to form a complex modulator.

The use of the modulator of this invention in displays requires high yield integration of individual modulator elements into 2-D arrays such as that illustrated in FIG. 6. This figure shows a plurality of grating modulators which can be used to provide a gray-scale operation. Each of the individual modulators consist of a number of beams and gray-scale can be obtained by addressing each modulator in a binary-weighted manner. The hysteresis characteristic for latching (as described above) can be used to provide gray-scale variation without analog control of the voltage supplied to individual grating modulator elements.

Figure 7:
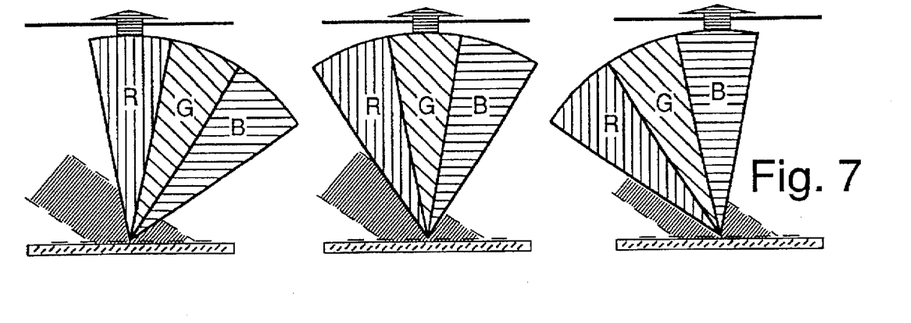
FIG. 7 illustrates the operation of the modulator in the modulation of colored light.

In FIG. 7 the use of the grating, in combination with other gratings, for modulating white light to produce colored light is illustrated. This approach takes advantage of the ability of a grating to separate a light spectrum into its constituent colors. By constructing separate red, green and blue modulation elements each with a grating designed to diffract the appropriate color into an optical system, a color display which is white light illuminated can be achieved. This approach is attractive for large area projection displays.

Alternative Embodiments

Figure 8:
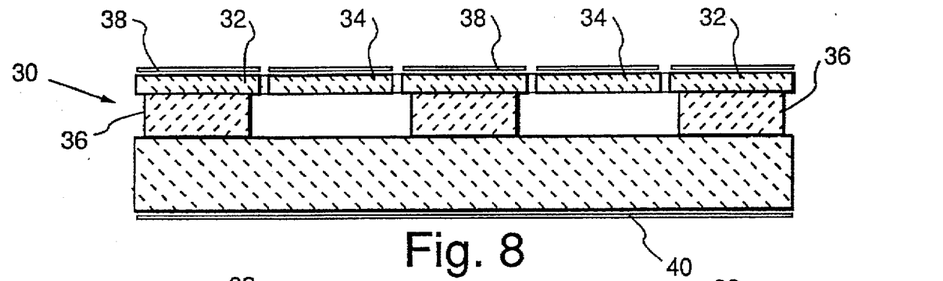
FIG. 8 is a cross-section similar to that in FIG. 3, illustrating an alternative embodiment of the modulator in its "non-defracting" mode.
Figure 9:
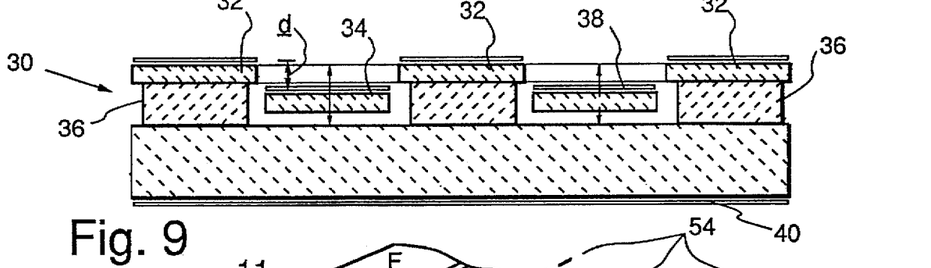
FIG. 9 is a cross-section similar to that in FIG. 4, illustrating the modulator in FIG. 8 in its "diffracting" mode.

In FIGS. 8 and 9 an alternative embodiment of the diffraction modulator 30 of the invention is illustrated. In this embodiment the modulator 30 consists of a plurality of equally spaced, equally sized, fixed beams 32 and a plurality of equally spaced, equally sized, movable beams 34 in which the movable beams 34 lie in the spaces between the fixed beams 32. Each fixed beam 32 is supported on and held in position by a body of supporting material 36 which runs the entire length of the fixed beam 32. The bodies of material 36 are formed during a lithographic etching process in which the material between the bodies 36 is removed.

Figure 10:
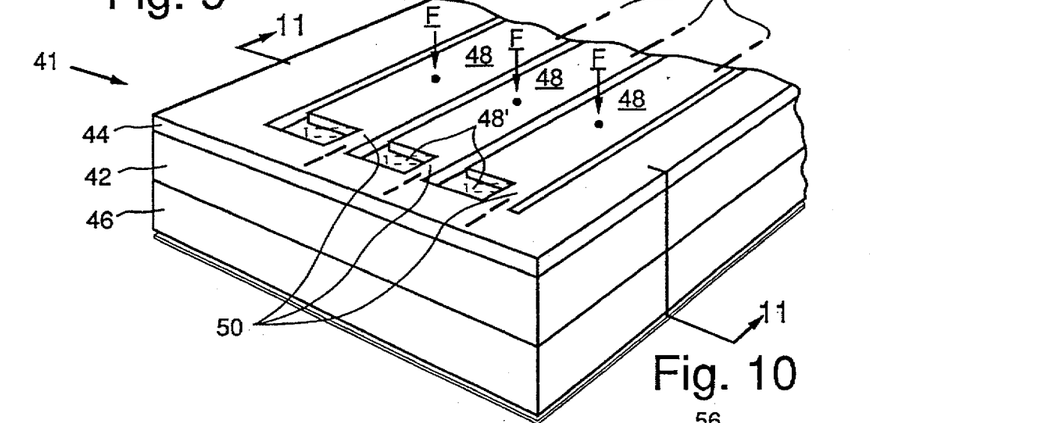
FIG. 10 is a pictoral view illustrating a further embodiment of the modulator.

As can be seen from FIG. 8 the fixed beams 32 are arranged to be coplanar with the movable beams 34 and present a flat upper surface which is coated with a reflective layer 38. As such the modulator 30 acts as a flat mirror when if reflects incident light, however, when a voltage is applied between the beams and an electrode 40 at the base of the modulator 30 the movable beams 34 move downwards as is illustrated in FIG. 10. By applying different voltages the resultant forces on the beams 34 and, therefore, the amount of deflection of the movable beams 34 can be varied. Accordingly, when the grating amplitude (defined as the perpendicular distance d between the reflective layers 38 on adjacent beams) is m/4 times the wavelength of the light incident on the grating 30, the modulator 30 will act as a plane mirror when m=0, 2, 4 . . . (i.e., an even number or zero) and as a reflecting diffraction grating when m=1, 3, 5 . . . (i.e., an odd number). In this manner the modulator 30 can operate to modulate incident light in the same manner as the modulator illustrated as the first embodiment.

Figure 11:
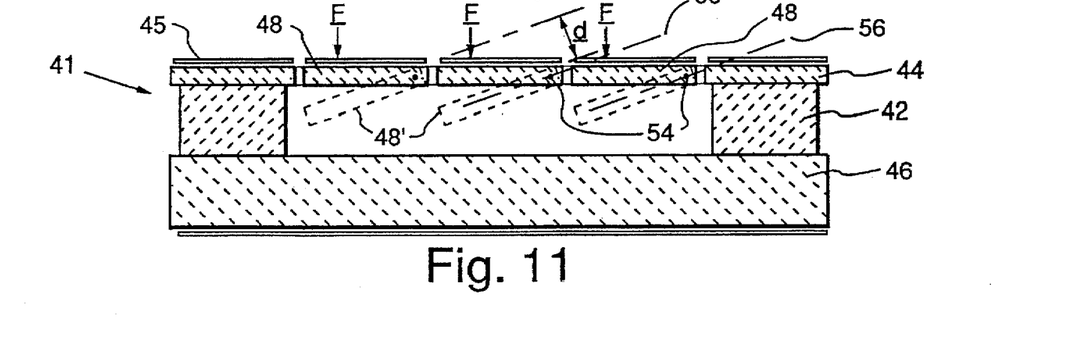
FIG. 11 is a cross-section along line 11—11 in FIG. 10.

Yet another embodiment of the modulator of the invention is illustrated in FIGS. 10 and 11. As with the other embodiments, this modulator 41 consists of a sacrificial silicon dioxide film 42, a silicon nitride film 44 and a substrate 46. In this embodiment, however, the substrate 46 has no reflective layer formed thereon and only the silicon nitride film 44 has a reflective coating 45 formed thereon. As is illustrated in FIG. 10 the deformable beams 48 are coplanar in their undeformed state and lie close to one another so that together they provide a substantially flat reflective surface. The beams 48 are, however, formed with a neck 50 at either end, which is off-center of the longitudinal center line of each of the beams 48.

When a uniformly distributed force, as a result of an applied voltage for example, is applied to the beams 48 the resultant force E, for each beam 48, will act at the geometric center 52 of that beam. Each resultant force F is off-set from the axis of rotation 54 (which coincides with the centerline of each neck 50), resulting a moment of rotation or torque being applied to each beam 48. This causes a rotation of each beam 48 about its axis 54 to the position 48' indicated in broken lines. This is known as "blazing" a diffraction grating.

As can be seen from FIG. 11, the reflective planes 56 of the beams 48 remain parallel to each other even in this "blazed" configuration and therefore, the grating amplitude d is the perpendicular distance between the reflective surfaces of adjacent beams. This "blazed grating" will operate to diffract light in the same manner as a sawtooth grating.

Figures 12A, 12B, 12C:
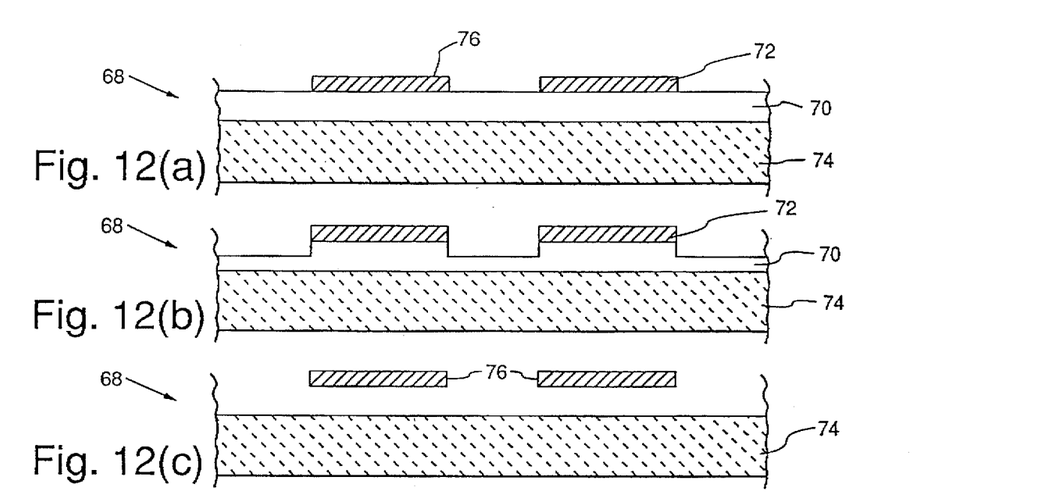

The basic fabrication procedure of yet another embodiment of the modulator 68 is illustrated in FIGS. 12(a)–(c). First, 132 nm of silicon dioxide layer 70 followed by 132 nm of silicon nitride layer 72 are deposited on a boron-doped wafer 74 using low pressure chemical vapor deposition techniques. The tensile stress in the silicon nitride layer 72 ranges from 40 to 800 MPa, depending on the ratio of the dichlorosilane and ammonia gases present during the deposition process. Tensile stress effects the performance of the modulator of the invention as higher tensile stress results in stiffer beams and, therefore, faster switching speeds but also requires higher voltages to operate the modulator.

Thereafter a photoresist (not shown) is layered onto the silicon nitride layer 72 and patterned after which the silicon nitride layer 72 is dry-etched down to the silicon dioxide layer 70 (FIG. 12(a)). The oxide layer 70 is also partially dry-etched as shown in FIG. 12(b). Then the photoresist is stripped.

Photoresist removal is followed by a buffered oxide etch which isotropically undercuts the silicon dioxide 70 from beneath the silicon nitride. Since the nitride frame (not shown) is wider than the remaining nitride beams 76, some oxide is left beneath it to act as an oxide spacer. Processing is completed when 30 nm layer of aluminum is evaporated onto the beams 76 and the substrate 74 to form the top and bottom electrodes and to enhance the reflectivity.

Typically the beams formed by this process would be either 1.0, 1.25 or 1.50 μm wide, which respectively can be used for blue, green and red light modulators.

It is possible that, when the released beam structures are dried, the surface tension forces of the solvents could bring the beams down and cause them to stick. In addition, when the modulators are operated the beams could come down into intimate contact with the substrate and stick.

Various methods could be used to prevent the sticking of the nitride beams to the substance: freeze-drying, dry etching of a photoresist-acetone sacrificial layer, and OTS monolayer treatments. These techniques seek to limit sticking by reducing the strength of the sticking specific-force (that is, force per unit of contact area). Furthermore, the use of stiffer beams by using shorter beams and tenser nitride films, is possible.

Since the force causing the beams to stick to the underlying material is the product of the contact area between the two surfaces and the specific force, however, other methods to reduce sticking could include:

(a) reducing the area of contact by roughening or corrugating; and (b) reducing the specific force by changing the chemical nature of the surfaces.

One method of reducing the contact area could be by providing a composite beam in which the top of the beam is Aluminum to enhance reflectivity, the second layer is stressed nitride to provide a restoring force, and the third layer is course-grained polysilicon to reduce effective contact area.

Still other methods of reducing the contact area between the bottoms of the beams and the substrate exist and are described below with reference to FIGS. 13(a)–15(c).

Figures 13A, 13B:
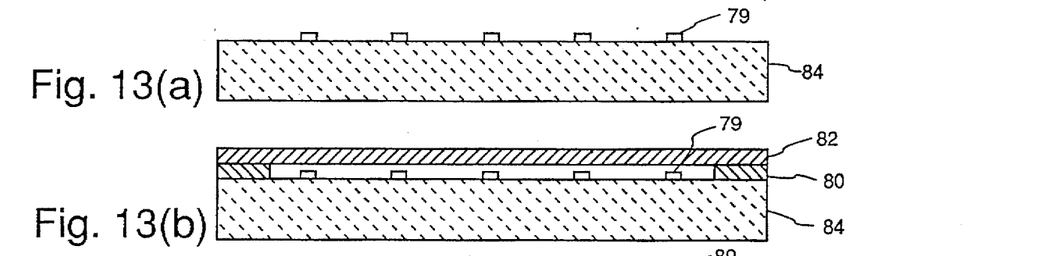

As is illustrated in FIGS. 13(a) and (b), contact area can be reduced by patterning lines 79 on the substrate or on the bottoms of the beams. These lines 79 are typically 1 μm wide, 200 Å high and spaced at 5 μm centers. As shown, the lines are arranged perpendicular to the direction of the beams and located on the substrate. Alternatively the lines could be parallel to the direction of the beams.

The procedure is to first pattern and dry etch a blank silicon wafer. Then a low temperature oxide layer 80 or other planar film is deposited followed by processing as above to yield the configuration in FIG. 13(b).

Figures 14A, 14B:
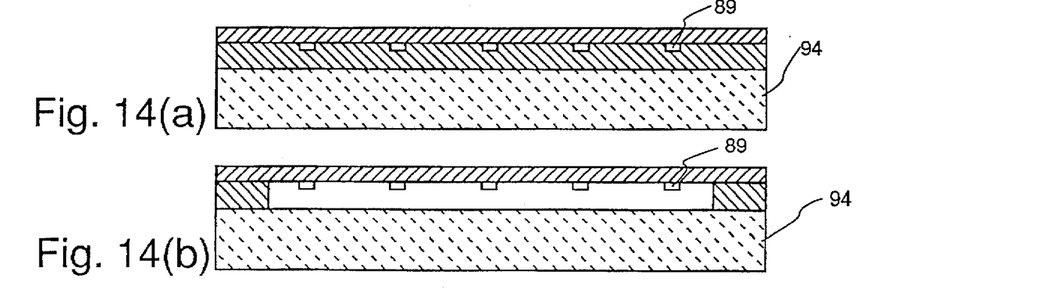

A different way of obtaining the same result is illustrated in FIGS. 14(a) and (b), in which oxide is grown on a bare silicon substrate 94, and patterned and dry or wet etched to form grooves 89, 1 μm wide on 5 μm centers, 200 Å deep after which processing continues as described above. This yields the final structure shown in FIG. 14(b).

Figures 15A, 15B, 15C:
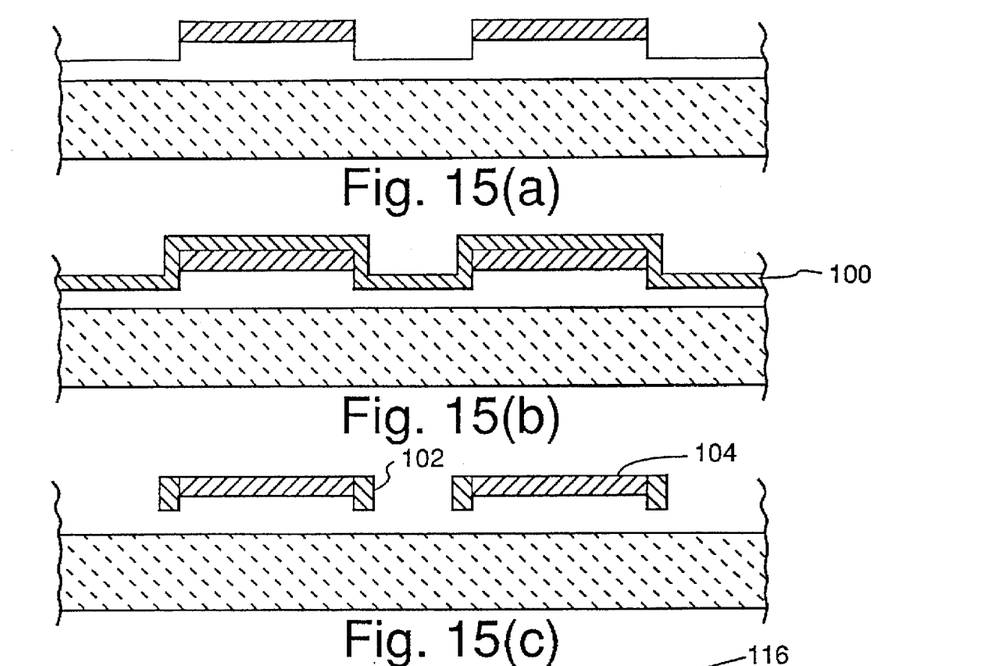

Yet another method of reducing the geometric area of contacting surfaces is illustrated in FIGS. 15(a)–(c).

After photoresist removal (FIG. 15(a)), a second layer 100 of about 50 nm nitride is deposited. As shown in FIG. 15(b), this second layer also coats the side-walls, such that a following anisotropic plasma etch which removes all of the second layer nitride 100 in the vertically exposed areas, leaves at least one side-wall 102 that extends below the bottom of each nitride beam 104. It is at this point that the buffered oxide etch can be done to release the beams to yield the structure of FIG. 15(c). With the side-wall spacer acting as inverted rails for lateral support, contact surfaces are minimized preventing sticking. In operation, it is believed that the beams, when deformed downwards, will only contact the substrate at the areas of the downwardly protruding rails.

As the adhesion forces are proportional to the area in contact, they are substantially reduced by this configuration resulting in operational gratings with beams having a tensile stress on the order 200 MPa and being up to 30 μm long. The rail structures also operate to maintain optically flat surfaces and have the advantage of not requiring additional masking steps during their manufacture.

Sticking can also be addressed by changing the materials of the areas that will come into contact. It is thought that although the level of sticking between different materials will be similar, the surface roughness of films differs significantly, effectively changing the contact area.

One method of achieving this is that the beam material can be changed to polycrystalline silicon. This material will have to be annealed to make it tensile. It can also use silicon dioxide as its sacrifial layer underneath.

Another method is to use a metallic beam material (e.g. aluminum) and an organic polymer such as polyimide as the sacrificial layer.

Figures 16A, 16B, 16C:
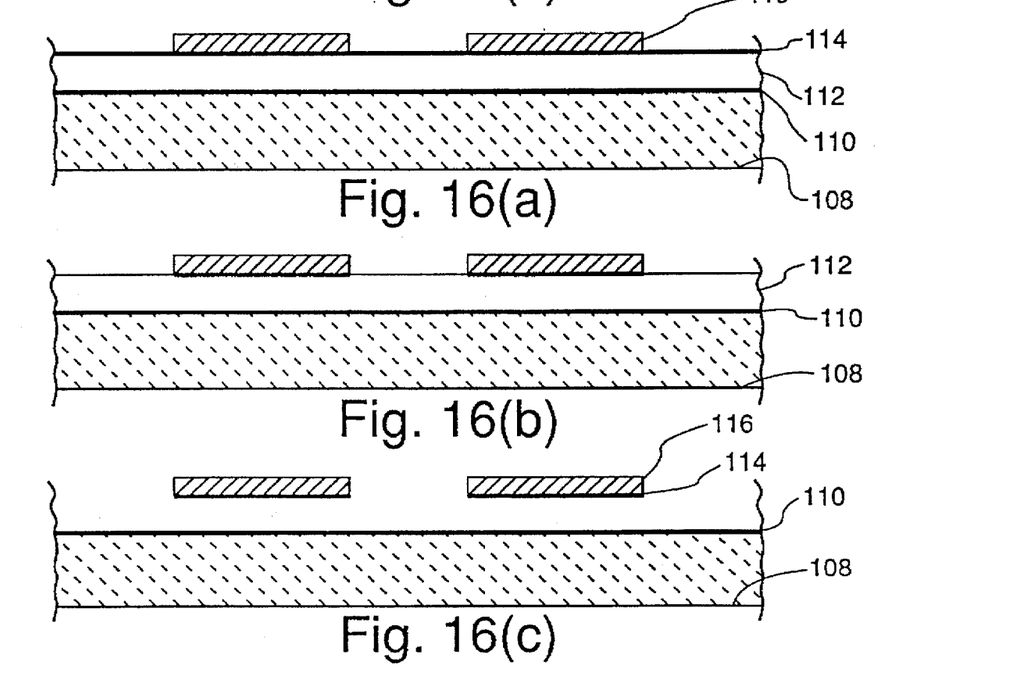

Yet another method is to use polymorphic beam material. This results in an initial multilayer structure which can be patterned, as described in FIGS. 16(a–16(c) to form a beam structure mostly made of silicon nitride but which has contact areas of other engineered materials.

This is done by:

(i) first depositing a substrate 108 covering layer 110 with low or high-stress silicon nitride or fine- or course-grained polymorphic beam material. This layer should be approximately 100 Å and acts as a first (lower) contact surface.

(ii) Deposit a layer 112 of low temperature oxide at 400° C.

(iii) Deposit a second contacting surface layer 114. This layer should be thin (about 100 Å) so as not to change the mechanical properties of the silicon nitride beam.

(iv) Finally, the silicon nitride beam material 116 is deposited after which dry-etching and undercutting similar to that described above is done.

One slight variation on the above process, which is illustrated in FIGS. 17(a)–(e), is to leave the substrate as a layer 120 of silicon dioxide over which a layer 122 of tungsten can be selectively deposited (e.g. by depositing only over exposed silicon surfaces). Instead of fully releasing the beams, as before, the oxide layer 120 is only partially removed by timing the etch to leave a thin column 124 of material supporting the beam structures from underneath (see FIG. 17(c)). Thereafter the wafers are placed back into a selective tungsten deposition chamber to get a layer 126 of tungsten covering the exposed silicon areas but not on the oxide columns 124 nor on the silicon nitride beams 128.

Figure 17A:
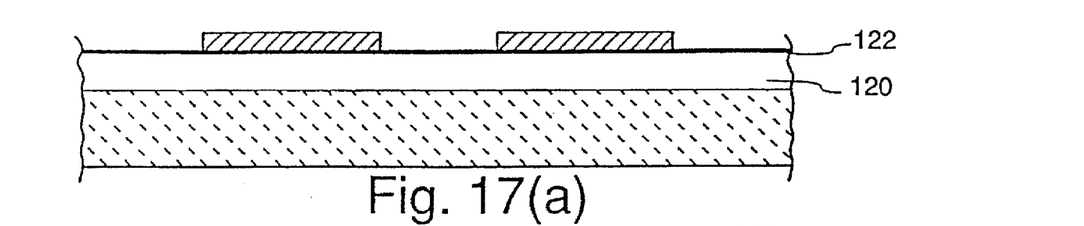
Figure 17B:
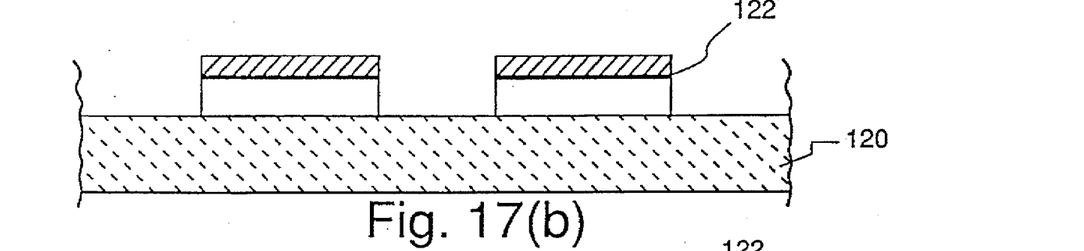
Figure 17C:
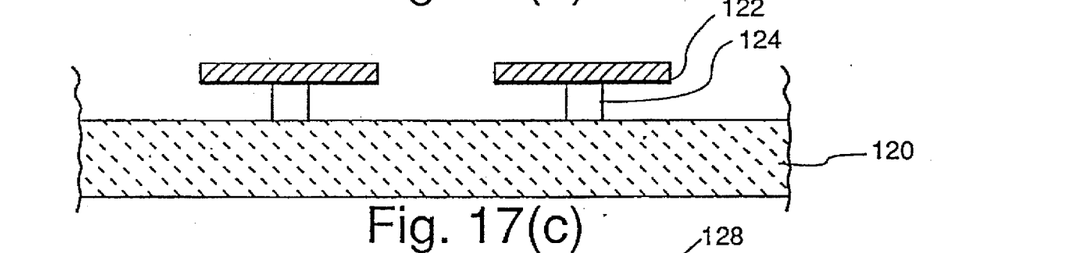
Figure 17D:
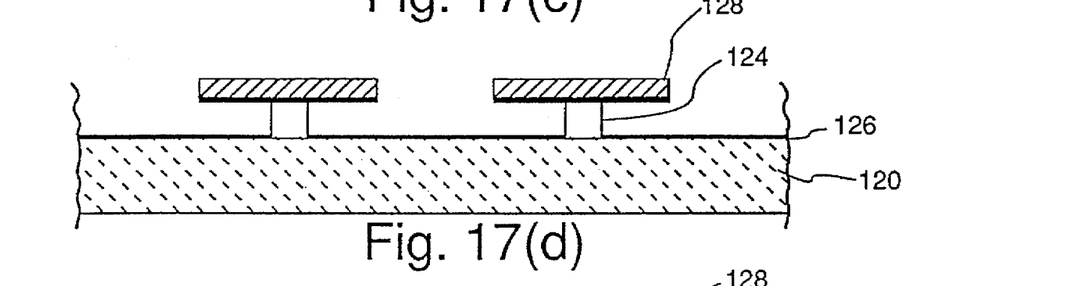
Figure 17E:
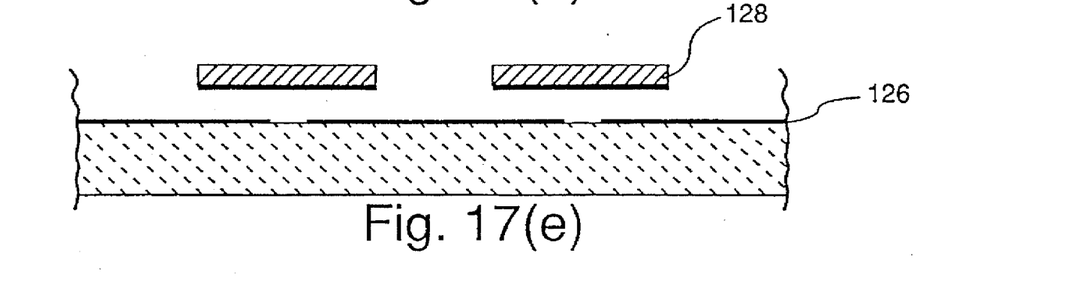

After depositing a thin layer 126 of tungsten as a new contact area, the oxide etch can be continued to fully release the beams 128 which, when deflected will come down onto a tungsten base.

Individual diffraction grating modulators in all of the above embodiments are approximately 25 µm square. To produce a device capable of modulating colored light (which contains red, green, and blue modulator regions) would therefore require a device 25×75 µm². To reduce this to a square device, each of the individual modulators must be reduced to 25×8 µm² by shortening the beams. Reduction of size in the other dimension is not possible because of diffraction limitations.

Figures 18A, 18B:
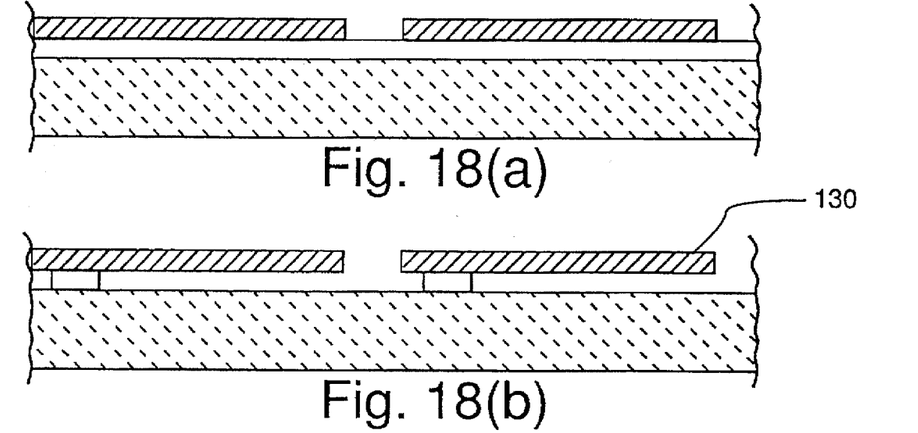

However, calculations reveal that 8 µm beams would, if constructed as described above, be too stiff to switch with practical voltages. A possible solution to this, as illustrated in FIGS. 18(a)–18(b), is the use of cantilever beams 130 rather than beams which are supported at either end. This is because beams that are supported at both ends are twice as stiff as cantilevers, which are supported at only one end.

Two-dimensional arrays of diffraction gratings may be constructed by defining two sets of conductive electrodes: the top, which are constructed as in the one-dimensional arrays out of metal or conductive silicon lithographically defined on the beam, and the bottom. Two methods may be used to define the bottom electrodes.

Figures 19A, 19B:
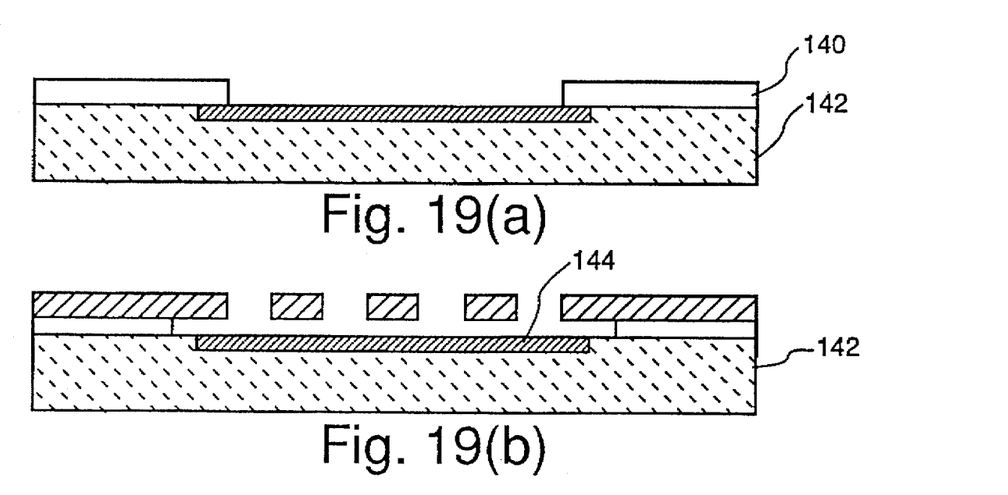

In the first method, illustrated in FIGS. 19(a) and (b), an oxide layer 140 is grown or deposited on a bare P- or N-type silicon wafer 142. The oxide is patterned and the wafer 142 subjected to a dopant diffusion of the opposite conductivity type, respectively N- or P-type, to produce a doped region 144. The beams are then fabricated on top of the diffused areas as previously described and aluminum is evaporated onto the surfaces as before. The diffused regions are held at ground and the PN junction formed with the substrate is reversed biased. This isolates the diffused regions from one another.

Figure 20:
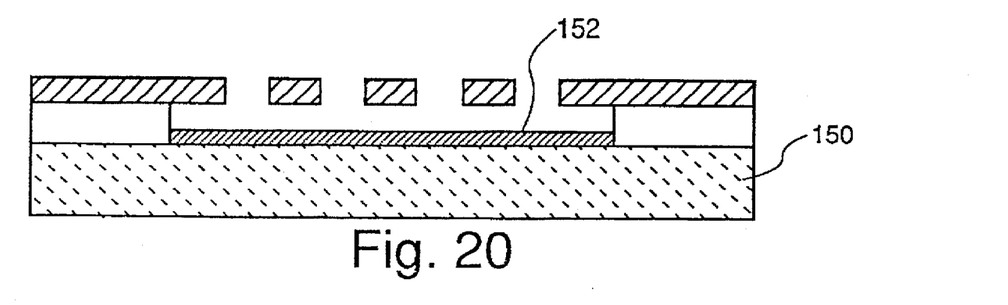

A second method shown in FIG. 20 is to use a non-conductive substrate 150 and pattern a refractory metal such as tungsten 152 over it. The wafer is then termally oxidized and nitride or other beam material is deposited over it. The beams are then patterned and released as above.

Although not illustrated in any of the figures above, it will be apparent that a deformable diffraction grating of the modulator can be constructed in which, in its undeformed state, all the reflective elements are in the form of movable beam elements arranged parallel, adjacent and coplanar with each other. In this type of modulator not only the grating amplitude (i.e., the perpendicular distance between adjacent reflective surfaces) can be varied but also the average height of all the reflective surfaces can be changed by moving all the beams relative to a fixed datum. This arrangement has the advantage that both the amplitude and the phase of the reflected/diffracted light can be modulated.

In summary, the reflective, deformable grating light modulator of this invention is a device which exhibits high resolution (25 by 8 µm² to 100 µm²); high response times/large bandwidth (2 to 10 MHz); high contrast ratio (close to 100% modulation with a 3 V switching voltage); is polarization independent and easy to use. This device also has tolerance for high optical power, has good optical throughput, is simple to manufacture, CMOS compatible, and has application in a wide range of fields including use as an SLM and with fiber optic technology.

Although the present invention has been described above in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of manufacturing a modulator for modulating a ray of light of determinable wavelength λ, comprising the steps of:

(i) providing a substrate;

(ii) depositing a sacrificial layer of thickness equal to λ/4 onto the substrate;

(iii) depositing a layer of resilient material of thickness equal to λ/4 onto the sacrificial layer;

(iv) etching the resilient material to produce a grating including a plurality of parallel beam elements encircled by a beam element supporting frame;

(v) removing the sacrificial layer except from below the frame, whereby the beam elements are supported a distance λ/4 above the substrate;

(vi) providing a reflective surface on the substrate and the beam elements; and (vii) providing means for moving the beam elements, relative to the substrate, between a first configuration wherein the modulator acts to reflect the incident rays of light as a plane mirror, and a second configuration wherein the modulator diffracts the incident rays of light as they are reflected therefrom.

2. A method of manufacturing a modulator as recited in claim 1, wherein the step of providing means for moving the beam elements includes the sub-step of providing means for applying an electrostatic force to the elements.

3. A method of manufacturing a modulator as recited in claim 2, wherein the step of providing reflective surfaces includes the substep of providing reflective metallic layers on the substrate and the beam elements.

4. A method of manufacturing a modulator as recited in claim 3, wherein the substep of providing means of applying an electrostatic force includes the providing of the reflective metallic layers.

5. A method of manufacturing a modulator as recited in claim 4, further comprising the step of providing means for preventing the grating from sticking to the substrate when the grating is moved towards the substrate.

6. A method of manufacturing a modulator as recited in claim 5 wherein the step of providing means for preventing the grating from sticking to the substrate includes the step of forming spacer elements positioned between the grating and the substrate.

7. A method of manufacturing a modulator as recited in claim 6, wherein at least one spacer element is attached to each beam element and arranged to protrude below the underside of the grating.

8. A method of manufacturing a modulator as recited in claim 7, wherein the spacer elements are located at the edges of their associated beam elements.

9. A method of manufacturing a modulator as recited in claim 6 wherein at least one spacer element is attached to the substrate and arranged to protrude into the space between the substrate and the underside of the grating.

10. A method of manufacturing a modulator as recited in claim 5, wherein the step of providing means for preventing the grating from sticking to the substrate includes the sub-step of providing a treated surface positioned between the grating and the substrate.

11. A method of manufacturing a modulator as recited in claim 10, wherein the treated surface is defined as the surface of a layer of material which is formed on at least one of the underside of the grating and the substrate.

12. A method of manufacturing a modulator as recited in claim 11, wherein the layer of material is formed on both the underside of the grating and the substrate.

* * * * *